United States Patent [19]
Shiozaki

[11] Patent Number: 5,977,477
[45] Date of Patent: Nov. 2, 1999

[54] PHOTOVOLTAIC DEVICE

[75] Inventor: Atsushi Shiozaki, Kyoto, Japan

[73] Assignee: Canon Kabushiki Kaisha, Tokyo, Japan

[21] Appl. No.: 09/083,131

[22] Filed: May 22, 1998

[30] Foreign Application Priority Data

May 30, 1997 [JP] Japan .................................. 9-141820

[51] Int. Cl.$^6$ .................................................. H01L 31/00
[52] U.S. Cl. ................................ 136/256; 438/71; 438/88
[58] Field of Search ............................ 136/256; 438/71, 438/88

[56] References Cited

U.S. PATENT DOCUMENTS

| | | | |
|---|---|---|---|
| 4,419,533 | 12/1983 | Czubatyj et al. | 136/259 |
| 4,532,372 | 7/1985 | Nath et al. | 136/256 |
| 5,500,055 | 3/1996 | Toyama et al. | 136/259 |

FOREIGN PATENT DOCUMENTS

| | | |
|---|---|---|
| 62-54192 | 3/1987 | Japan . |
| 62-54921 | 3/1987 | Japan . |
| 8-217443 | 8/1996 | Japan . |

Primary Examiner—Mark Chapman
Attorney, Agent, or Firm—Fitzpatrick, Cella, Harper & Scinto

[57] ABSTRACT

A method for making a photovoltaic device includes the steps of: (a) forming a transparent conductive layer on a substrate, (b) putting the surface of the transparent conductive layer into contact with an ionized inert gas, and (c) forming a semiconductor layer thereon. The transparent conductive layer is formed such that in the cross-section of the transparent conductive layer, a mean distance between relative minimum points is 2,000 nm or less and a mean tilt angle between a surface line originated from a measuring point and a base line connecting to the nearest two adjacent relative minimum points over the entire measured region is 5° or more.

13 Claims, 3 Drawing Sheets

PHOTOVOLTAIC DEVICE

BACKGROUND OF THE INVENTION

1. Field of the Invention

The present invention relates to a photovoltaic device having high photovoltaic efficiency, that is one in which, the incident light is effectively converted into electrical energy and the generated electrical energy is conducted to the external device with reduced loss. The present invention also relates to a method for making the same.

2. Description of the Related Art

Various types of photovoltaic devices have been used as isolated power sources for electrical equipment and alternative energy sources for systematic electric power supply, and there has been continued research and development.

Photovoltaic elements themselves, for example, crystalline photovoltaic devices composed of single-crystal or polycrystalline silicon and thin film photovoltaic devices using compound semiconductors, have been intensively studied and developed. Relevant technologies other than the photovoltaic elements also have been studied and developed. Examples of such technologies include technologies regarding effective conversion of the incident light to electrical energy and effective extraction of the generated electrical energy to the exterior.

U.S. Pat. No. 4,419,533 discloses a technology for effectively converting the incident light to electrical energy, in which a metal reflection layer has unevenness and a barrier layer composed of zinc oxide, etc., is provided to prevent diffusion of the constituent elements of the reflection layer to the photovoltaic element. U.S. Pat. No. 5,500,055 discloses another technology for trapping the incident light in the device, in which a smooth reflection layer is provided, and the surface of the barrier layer is etched by an aqueous solution to form unevenness on the surface.

A technology for effectively extracting the generated electrical energy is disclosed in U.S. Pat. No. 4,532,372, wherein a transparent conductive layer is provided to prevent self-consumption of the generated electrical energy caused by short-circuiting due to photovoltaic device defects.

Fabrication processes are also disclosed. For example, Japanese Patent Laid-Open No. 62-54921 discloses a process for achieving an increased photovoltaic current flow, in which a substrate is exposed to hydrogen plasma before fabricating an amorphous-silicon semiconductor device. In Japanese Patent Laid-Open No. 8-217443, zinc oxide is produced from an aqueous solution containing a nitrate and zinc by electrodeposition.

The present inventors have reviewed the configuration of the transparent conductive layer disclosed in U.S. Pat. Nos. 4,419,533 and 5,500,055. In such a configuration, a reflection layer is formed and a transparent conductive layer is provided thereon. The transparent conductive layer functions as a barrier layer for preventing diffusion of the constituent material of the reflection layer to the photovoltaic element, scatters the incident light to effectively use it, and prevents short-circuiting by defects in the semiconductor layer.

Therefore, optimized sputtering and electrodeposition conditions enable the reliable formation of an uneven transparent conductive layer. Further, etching of the uneven surface with an aqueous solution further enhances the surface roughness. In the operation under a load, however, the voltage sometimes drops. In such a case, the photovoltaic device has a fill factor far from 100%; hence, there is room for improvement of the device in this regard.

The present inventors have further studied the surface treatment with hydrogen plasma and then oxygen plasma as disclosed in Japanese Patent Laid-Open No. 62-54192. When an oxide transparent conductive layer is subjected to such treatment, short-circuiting often occurs and thus a photovoltaic device having stable characteristics is not obtainable. According to electron microscopy of the transparent conductive layer, some cracks and sharp ridges are observed on the surface of the deposited film. It is presumed that reduction by hydrogen and oxidation by oxygen cause changes in the composition in the film, and a stress is applied onto the surface.

SUMMARY OF THE INVENTION

Accordingly, it is an object of the present invention to provide a photovoltaic device, and a method of making the same, that avoid the shortcomings of the prior art, discussed above.

An aspect of the present invention is to provide a method for making a photovoltaic device comprising the following steps of: (a) forming a transparent conductive layer on a substrate, (b) putting the surface of the transparent conductive layer into contact with an ionized inert gas, and (c) forming a semiconductor layer thereon.

Preferably, the method further includes a step of etching the surface of the transparent conductive layer before the above-mentioned step (b).

Preferably the transparent conductive layer may be formed such that in the cross-section of the transparent conductive layer, a mean distance between relative minimum points is 2,000 nm or less and a mean tilt angle between a surface line originated from a measuring point and a base line connecting to the nearest two adjacent relative minimum points over the entire measured region is 5° or more.

Preferably, the processing time in the step (b) is controlled such that the mean tilt angle is 5° or more.

Another aspect of the present invention is to provide a photovoltaic device including a substrate, a transparent conductive layer having a rough surface, and a semiconductor layer, wherein, in the cross-section of the transparent conductive layer, a mean distance between relative minimum points is 2,000 nm or less and a mean tilt angle between a surface line originating from a measuring point and a base line connecting to the nearest two adjacent relative minimum points over the entire measured region is 5° or more.

DESCRIPTION OF THE PREFERRED EMBODIMENTS

Figure 1B:
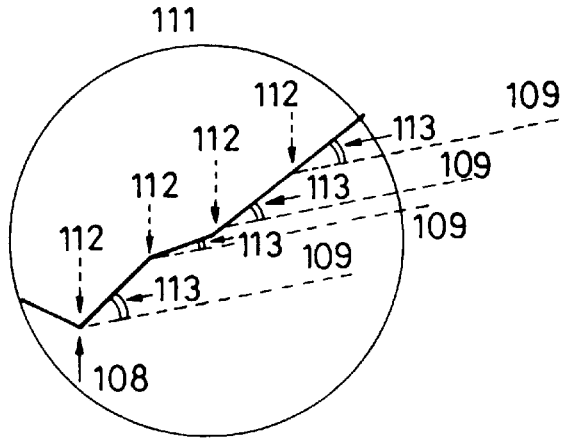
FIGS. 1A and 1B are schematic cross-sectional views of a photovoltaic device as an embodiment in accordance with the present invention, FIG. 1B showing a detail of FIG. 1A.
Figure 1A:
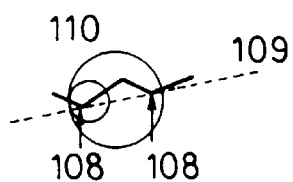

FIG. 1A is a cross-sectional view of a photovoltaic device as an embodiment in accordance with the present invention.

In FIG. 1A, a length corresponding to 5,000 nm is depicted. A part is enlarged as referred to by numeral 110, and a part of the enlarged section is further enlarged as referred to by numeral 111.

A transparent conductive layer 102 composed of zinc oxide or the like is formed on a substrate 100 provided with a reflection layer 101 by sputtering or electrodeposition using an aqueous solution. The shape of the surface 103 of the transparent conductive layer is quantitatively determined by topographic analysis with a commercially available atomic force microscope or a commercially available electron microscope. When the heights of the surface at points 112 (hereinafter referred to as measuring points) having a given interval are determined over the region of 5,000 nm, many relative minimum points 108 are observed (see FIG. 1B). Such measurement is performed in the two orthogonal directions, that is, the horizontal and vertical directions. The surface roughness can therefore be determined over the region of 5,000 nm by 5,000 nm. An angle 113 (hereinafter referred to as a tilt angle) between the surface line originating from a measuring point 112 and a base line 109 connecting the nearest two adjacent relative minimum points 108 is determined. The roughness of the surface 103 of the transparent conductive layer is represented by a mean value of tilt angles 113 for all the measuring points 112. Such a mean value can eliminate the effect of the surface roughness of a substrate 100 and a reflection layer 101. When the surface has a mean value of 5° or more, the transparent conductive layer 102 can be used without modification. When the surface 103 of the transparent conductive layer has a mean value of less than 5°, the surface 103 may be subjected to wet etching in an aqueous acetic acid solution to form rougher unevenness on the surface.

Figure 1:
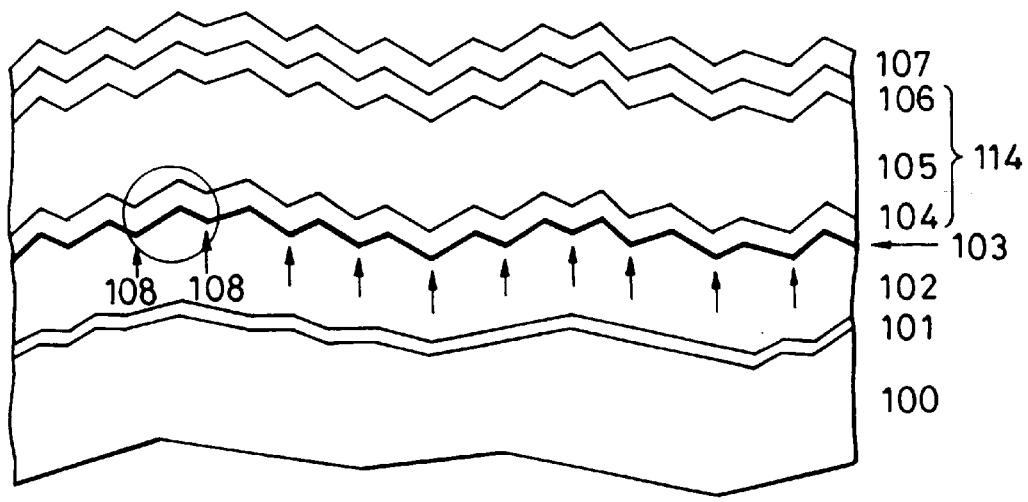
Figure 2:
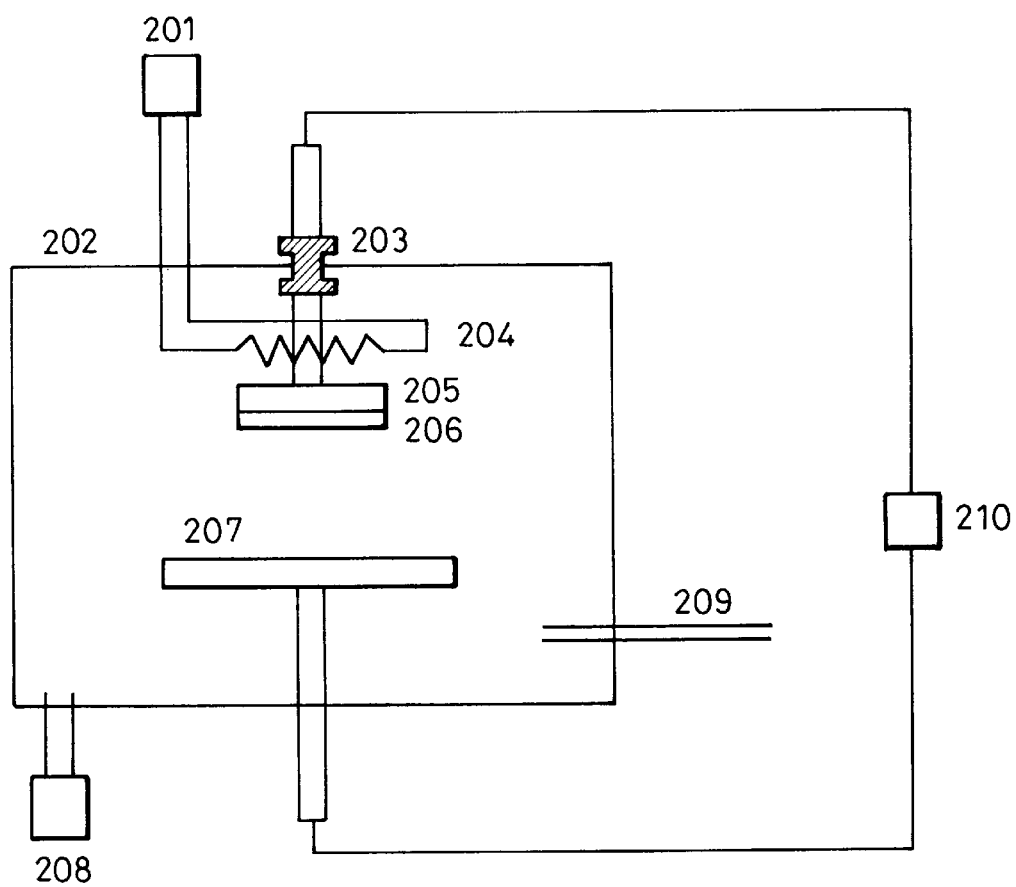
FIG. 2 is a schematic cross-sectional view of a batch system for putting a surface of a transparent conductive layer into contact with ionized gas.

As shown in FIG. 2, the substrate 206 is placed on a substrate holder 205 in a vacuum chamber 202. The vacuum chamber 202 is evacuated by a vacuum pump 208 to a given pressure, and an inert gas such as argon is supplied though a gas inlet pipe 209 while adjusting the chamber to a give pressure by rotation of an evacuating valve not shown in the drawing. The substrate 206 is heated by a heater 204 provided above the substrate holder 205 to a given temperature. A substrate temperature ranging from 100° C. to 400° C. is preferred for achieving a high photovoltaic efficiency. A given voltage is supplied between a counter electrode 207 and the substrate holder 205 for a given time through an electrical power source 210, so that the inert gas is thereby ionized. The surface 103 of the transparent conductive layer shown in FIG. 1 is put into contact with the ionized inert gas. When a high electrical power is applied or the surface is put into contact with the ionized inert gas for a long time, the surface 103 is substantially planarized. Thus, the electrical power and the operational time must be controlled so that the mean value of tilt angles 113 is not less than 5°. The process can be independently performed in a batch-type vacuum chamber. Alternatively, the process may be performed to the transparent conductive layer formed on a long substrate in an in-line or roll-to-roll apparatus. The process can also be performed at the former section of an in-line apparatus for semiconductor devices.

A semiconductor junction layer 114 is formed on the surface-treated transparent conductive layer by a plasma CVD process. The semiconductor junction layer 114 is composed of, for example, an n-type a-Si semiconductor layer 104, an i-type a-Si semiconductor layer 105, and a p-type amorphous silicon (hereinafter a-Si) semiconductor layer 106. When a thin semiconductor junction layer 114 is formed, the unevenness of the surface 103 of the transparent conductive layer will reflect the unevenness of the entire semiconductor junction layer 114, as shown in FIG. 1B.

A transparent conductive layer 107 is formed in another vacuum chamber. The transparent conductive layer 107 also functions as an antireflection layer. After a comb collective electrode and a leading electrode are provided, the device is encapsulated with a protective resin.

The photovoltaic device made by such a process has a high fill factor and an improved photovoltaic efficiency. In addition, the photovoltaic device maintains initial characteristics for a long time; hence, it is highly reliable.

Components of the photovoltaic device in accordance with the present invention will now be described.

(Substrate and Reflection Layer)

Metals, alloys and composites thereof, a carbon sheet provided with a reflection layer, and a resin film, such as a polyimide film, provided with a conductive layer can be used as the substrate 100. These materials can be used as long rolled substrates; hence, they are suitable for continuous fabrication processes. Alternatively, the reflection layer and the conductive layer may be provided on a crystal substrate such as a silicon substrate, or a glass or ceramic substrate according to the use. When a conductive substrate is used it functions as an electrode of the device. The surface of the substrate may be polished or cleaned before use, or the substrate may be used without such treatment. Substrates having surface roughness can also be used. The use of a magnetic material, such as SUS430, permits accurate control of the position of the substrate by a roller including a magnet in the transfer process.

When a substrate having a high reflectance is used, the reflection layer 101 is not always necessary. When the substrate is composed of an insulating material, a reflection layer which also functions as an electrode is provided. When stainless steel or carbon is used as the substrate 100, a reflection layer composed of aluminum or the like is formed by a sputtering process or the like.

(Transparent Conductive Layer)

The transparent conductive layer 102 can be formed by a sputtering process, a vacuum evaporation process, a chemical vapor deposition process, an ion plating process, an ion beam process or an ion beam sputtering process. It can also be formed by an electrodeposition or dipping process in an aqueous solution containing nitrate, acetate and ammonium groups and metal ions. It is preferable that the transparent conductive layer 102 has high transparency to transmit the incident light towards the reflection layer or the substrate. Further, the transparent conductive layer preferably has moderate resistance to suppress a current flow through defects in the semiconductor layer. The preferable transmittance is 90% or more, and the preferable conductivity ranges from $10^{-8} \times 1/\Omega cm$ to $10^{-1} \times 1/\Omega cm$. Examples of preferable materials for the transparent conductive layer include zinc oxide, indium oxide, tin oxide, and materials containing at least one of these oxides.

An unevenness of several hundred nm can be formed on the surface of the transparent conductive layer by controlling the conditions in the process, or can be formed by wet etching of a smooth surface in an aqueous acetic acid solution. For example, in the sputtering process, prominent unevenness on the transparent conductive layer is formed under conditions of a high substrate temperature, a low deposition speed and a large layer thickness. In the electrodeposition process, prominent unevenness is formed under conditions of a high metal ion concentration, for example, a zinc ion concentration, in the aqueous solution and a large layer thickness.

(Treatment with Ionized Gas)

An inert gas, such as helium, neon or argon, is fed into a closed container. Ionized inert gas is generated by applying energy, such as a direct current, high-frequency waves, or microwaves, or by cyclotron irradiation. In this step, the substrate is preferably heated to 100° C. to 400° C. with an infrared lamp or a sheathed wire heater or by magnetic induction. A photovoltaic device having a high conversion can be obtained by heating the substrate to 100° C. to 400° C. even when no difference in the surface shape after the treatment between different temperatures is observed, although the reason is not clarified.

Other conditions for the treatment are determined in view of various factors, such as intensity and time of the supplied energy, the type of the inert gas, and the relative position between the generated ionized gas and the substrate. Since the surface is generally planarized by the treatment, these conditions must be determined so that the mean tilt angle of the surface of the transparent conductive layer after treatment is not less than 5°. For example, when a direct current or high-frequency electric power source is applied for ionizing helium or argon in a diode parallel plate system, a satisfactory surface is obtained by applying a power of 0.1 w/cm$^2$ to 10 w/cm$^2$ for 5 seconds to 10 minutes under a pressure of 10 torr to 1 mtorr.

The process can be independently performed in a batch-type vacuum chamber shown in FIG. 2. Alternatively, the process may be performed to the transparent conductive layer formed on a long substrate in an in-line apparatus shown in FIG. 3. The process can also be performed at the former section of an in-line apparatus for semiconductor devices (not shown in the drawings).

(Semiconductor Layer)

The semiconductor layer can be formed by a CVD system using high frequency, VHF, or microwave electrical power. SiH$_4$, SiF$_4$, PH$_3$, and H$_2$ are fed into the vacuum chamber as material gases to form the n-type a-Si layer 104 on the transparent conductive layer 103. Next, SiH$_4$, SiF$_4$, and H$_2$ are fed into the vacuum chamber as material gases to form the i-type a-Si layer 105 on the n-type a-Si layer 104. Finally, SiH$_4$, BF$_3$, and H$_2$ are fed into the vacuum chamber as material gases to form the p-type microcrystalline Si (hereinafter μc-Si) layer 106 on the i-type a-Si layer 105. The nip semiconductor junction layer is thereby formed. Other semiconductor layers other than the amorphous semiconductor layers and microcrystal semiconductor layers may also be used in the present invention. As the semiconductor junction layer, both nip and pin configurations can be used. Tandem and triplet devices having a plurality of semiconductor junction layers may also be used in the present invention.

(Transparent Electrode)

The transparent electrode 107 is provided on the surface, away from the substrate and the reflection layer, of the semiconductor junction layer 114, and functions as an antireflection layer. It is preferable that the transparent electrode 107 has low reflectance and low resistance. The transparent electrode 107 can be formed by a resistance-heating or electron-beam vacuum-evaporation process, a sputtering process, a CVD process, a spraying process, or a dipping process using indium oxide, tin oxide, titanium oxide, zinc oxide, or a mixture thereof as a raw material. When the refractive index of the antireflection film is n and the wavelength of the antireflective light is λ, a transparent electrode 107 having a thickness of λ/4n develops excellent antireflection effects. The transparent electrode 107 may be composed of a plurality of layers having different refractive indices.

(Collective Electrode and Protective Resin)

A grid collective electrode may be provided on the transparent electrode for effectively collecting the generated current flows. The collective electrode is formed by, for example, a sputtering process using a mask pattern, a resistance heating process, a CVD process, a patterning process in which a metal film is deposited on the entire surface and unnecessary parts are removed by etching, a photo CVD process which can directly form the grid electrode, a plating process after the formation of a mask of a negative grid-electrode pattern, a printing process of a conductive paste, a bonding process of a metal wire with a conductive paste.

Output terminals may be connected to the substrate and the collective electrode to extract the electromotive force, if necessary. A protective resin may be used if necessary, for example, a resin film is bonded to the photovoltaic device. A reinforcing material, such as a steel sheet, may also be used in combination.

EXAMPLE 1

In Example 1, photovoltaic devices having a configuration as shown in FIG. 1 were prepared by a batch system, and the unevenness was formed on the surface of the transparent conductive layer by a wet-etching process.

A square dull-finished stainless steel (SUS430) substrate having a side of 45 mm and a thickness of 0.15 mm was used as a substrate 100. Eight substrates, an aluminum target having a diameter of 6 inches, and a zinc oxide target having a diameter of 6 inches were placed into a DC magnetron sputtering system, and the chamber was evacuated to a pressure of 10$^{-5}$ torr or less. Gaseous argon was fed into the chamber at 30 sccm while maintaining the pressure at two mtorr. A direct current of 120 W was applied to the aluminum target for 90 seconds without heating the substrates. An aluminum reflection layer with a thickness of 70 nm was formed on each of the substrates. After the substrates were heated to 100° C., a direct current of 500 W was applied to the zinc oxide target for 10 minutes. A transparent conductive layer of zinc oxide having a thickness of approximately 1,000 nm was formed on each substrate.

The surface of the transparent conductive layer was observed by an atomic force microscope (Qscope 250 made by Quesant, U.S.A.) with a probe having a tip radius of 20 nm, a tip angle of 36°, and a length of 200 nm. Heights at 63,001 points were determined at an interval of 20 nm over a region of 5,000 nm square. The mean distance between relative minimums 108 in the horizontal (X) direction was approximately 500 nm, and the mean tilt angle between a surface line originated form a measuring point 112 and a base line 109 was approximately 30°. These values were the same as those of the surface of the SUS430 substrate. Accordingly, the transparent conductive layer did not have substantially a rough surface.

Three among the eight substrates were immersed in an aqueous 5% acetic acid solution at 30° C. for 15 seconds, 30 seconds, and 1 minute, respectively. The surfaces of the wet-etched substrates were observed again. The mean distances between relative minimums ranged from approximately 290 nm to 330 nm, and the mean tilt angles ranged from approximately 10° to 20°.

The three etched substrates were placed on the substrate holder 205 in the chamber shown in FIG. 2, and the chamber was evacuated to 10$^{-4}$ torr by a vacuum pump 208. Gaseous helium of 30 sccm was fed through the gas inlet pipe 209, and the temperature of each substrate 206 was maintained at 300° C. by the heater 204 while maintaining the pressure in the chamber at 1 torr. A DC current of 1 W/cm$^2$ was applied between the substrate holder 205 as a negative electrode and the counter electrode 207 for 20 seconds, so that the surface of the substrate 103 was put into contact with ionized gas generated by glow discharge. The surface of each substrate was observed by an atomic force microscope, and slight planarization was recognized.

These substrates were placed into a commercially available capacitively coupled plasma enhanced CVD system. The reaction chamber was evacuated by an evacuating pump through the evacuation tube to a high degree of vacuum, while maintaining the surface temperature of the substrate at 250° C. by a thermostat mechanism. After completion of the evacuation, $Si_2H_6$ of 1 sccm, $PH_3/H_2(PH_3: 1\%)$ of 0.5 sccm, and $H_2$ of 40 sccm were fed into the chamber through gas inlet pipes, while the pressure in the reaction chamber was maintained at 1 torr by turning the throttle valve. Immediately after the pressure was stabilized, an electrical power of 3 W was applied through a high-frequency electrical power source for 180 seconds to generate plasma. An n-type a-Si semiconductor layer 104 was thereby formed on the transparent conductive layer 102. After evacuating again, $Si_2H_6$ of 40 sccm and $H_2$ of 40 sccm were fed into the chamber through gas inlet pipes, while the pressure in the reaction chamber was maintained at 1 torr by turning the throttle valve. Immediately after the pressure was stabilized, an electrical power of 2 W was applied through a high-frequency electrical power source for 600 seconds to generate plasma. An i-type a-Si semiconductor layer 105 was thereby formed on the n-type a-Si semiconductor layer 104. After evacuating again, $SiH_4/H_2$ ($SiH_4$: 10%) of 0.5 sccm, $BF_3/H_2$ ($BF_3$: 1%) of 1 sccm, and $H_2$ of 50 sccm were fed into the chamber through gas inlet pipes, while the pressure in the reaction chamber was maintained at 1 torr by turning the throttle valve. Immediately after the pressure was stabilized, an electrical power of 200 W was applied through a high-frequency electrical power source, for 120 seconds to generate plasma. A p-type μc-Si semiconductor layer 106 was thereby formed on the i-type a-Si semiconductor layer 105.

The substrates were transferred onto an anode in a DC magnetron sputtering system, and the sides of the substrates were shielded with a stainless steel mask. A central region of 40 mm by 40 mm on the substrate surface was sputtered using a target composed of 10 percent by weight of tin oxide and 90 percent by weight of indium oxide to form a transparent electrode of indium tin oxide (ITO). The sputtering was performed under the following conditions, that is, a substrate temperature of 200° C., a flow rate of argon as an inert gas of 50 sccm, a flow rate of oxygen of 0.5 sccm, a chamber pressure of 3 mtorr, an input power of 0.2 W/cm$^2$. The resulting transparent electrode had a thickness of 60 nm for a deposition time of approximately 100 seconds. The deposition time for a give thickness was MO determined by a calibration curve of deposition time vs. thickness which was previously determined under the same conditions.

A collective electrode was formed on a region of 2% of the surface area by screen printing of a silver paste. Output terminals were attached and the resulting substrate was encapsulated with a protective resin. Photovoltaic devices were thereby prepared.

The photovoltaic devices were irradiated with light of AM1.5 (100 mW/cm$^2$) to evaluate their photovoltaic efficiencies. The photovoltaic efficiencies ranged from 112% to 114% of that of the (non-etched) photovoltaic device of Comparative Example 1. The devices were subjected to an environmental test in an environmental box at 85° C. and 85% humidity for 1,000 hours. The photovoltaic efficiencies decreased by just 0.02%, which is a highly satisfactory level in practical use.

Comparative Example 1

Two substrates each provided with the transparent conductive layer among the remaining five substrates in Example 1 were used. One substrate was not etched and the other substrate was wet-etched in an aqueous acetic acid solution for 5 seconds. Two photovoltaic devices were formed using these substrates as in Example 1. The mean distances between relative minimums were 500 nm and 450 nm, respectively, and the mean tilt angles were 3.2° and 4.40°, respectively. These values were substantially the same as those of the substrate surface.

The photovoltaic devices were irradiated with light of AM1.5 (100 mW/cm$^2$) to evaluate their photovoltaic efficiencies. The photovoltaic efficiency of the device subjected to etching for 5 seconds was 102% of that of the non-etched photovoltaic device.

EXAMPLE 2

Two substrates each provided with the transparent conductive layer prepared in Example 1 were used. These substrates were wet-etched in an aqueous acetic acid solution for one minute. Two photovoltaic devices were formed using these substrates as in Example 1, but the substrate temperature was changed to 50° C. and 450° C., respectively. The mean distance between relative minimums was 280 nm, and the mean tilt angle was 18°. These values were substantially the same as those of the substrate surface treated at 300° C.

The photovoltaic devices were irradiated with light of AM1.5 (100 mW/cm$^2$) to evaluate their photovoltaic efficiencies. The photovoltaic efficiency of each device was 104% of that of the non-etched photovoltaic device of Comparative Example 1.

The efficiency was lower than that in Example 1. Since the devices of Example 2 had a low fill factor, it is assumed that the substrate temperature in the treatment with ionized gas affects the contact angle at the interface between the transparent electrode and the semiconductor layer. According to the experimental results at various substrate temperatures in the treatment with ionized gas, the preferred temperature in the treatment ranges from 100° C. to 400° C.

Comparative Example 2

One substrate provided with the transparent conductive layer prepared in Example 1 was used. The substrate was wet-etched in an aqueous acetic acid solution for 30 seconds. A photovoltaic device was formed using the substrate as in Example 1, but the treatment with ionized gas was performed at a substrate temperature of 300° C. for 10 minutes. The mean distance between relative minimums was 290 nm, and the mean tilt angle was 4.0°. Accordingly, the surface was planarized by the treatment with ionized gas.

The photovoltaic device was irradiated with light of AM1.5 (100 mW/cm$^2$) to evaluate the photovoltaic efficiency. The photovoltaic efficiency was 101% of that of the non-etched photovoltaic device of Comparative Example 1.

The results are summarized in Table 1.

TABLE 1

|  | Etching time | Treatment with ionized gas | Mean distance | Mean tilt angle | Short-circuiting current | Fill factor | Photo-voltaic efficiency |
|---|---|---|---|---|---|---|---|
| Example 1 | 15 sec. | 300° C., 20 sec. | 320 nm | 8.3° | 112% | 100% | 112% |
|  | 30 sec. |  | 290 nm | 12° | 115% | 98% | 113% |
|  | 1 min. |  | 280 nm | 18° | 120% | 95% | 114% |
| Comp. Ex. 1 | 0 sec. | 300° C., 20 sec. | 500 nm | 3.2° | 100% | 100% | 100% |
|  | 5 sec. |  | 450 nm | 4.4° | 102% | 100% | 102% |
| Example 2 | 1 min. | 50° C., 20 sec. | 280 nm | 18° | 118% | 88% | 104% |
|  | 1 min. | 450° C., 20 sec. | 280 nm | 18° | 117% | 89% | 104% |
| Comp. Ex. 2 | 30 sec. | 300° C., 10 min. | 290 nm | 4.0° | 101% | 100% | 101% |

EXAMPLE 3

Figure 3:
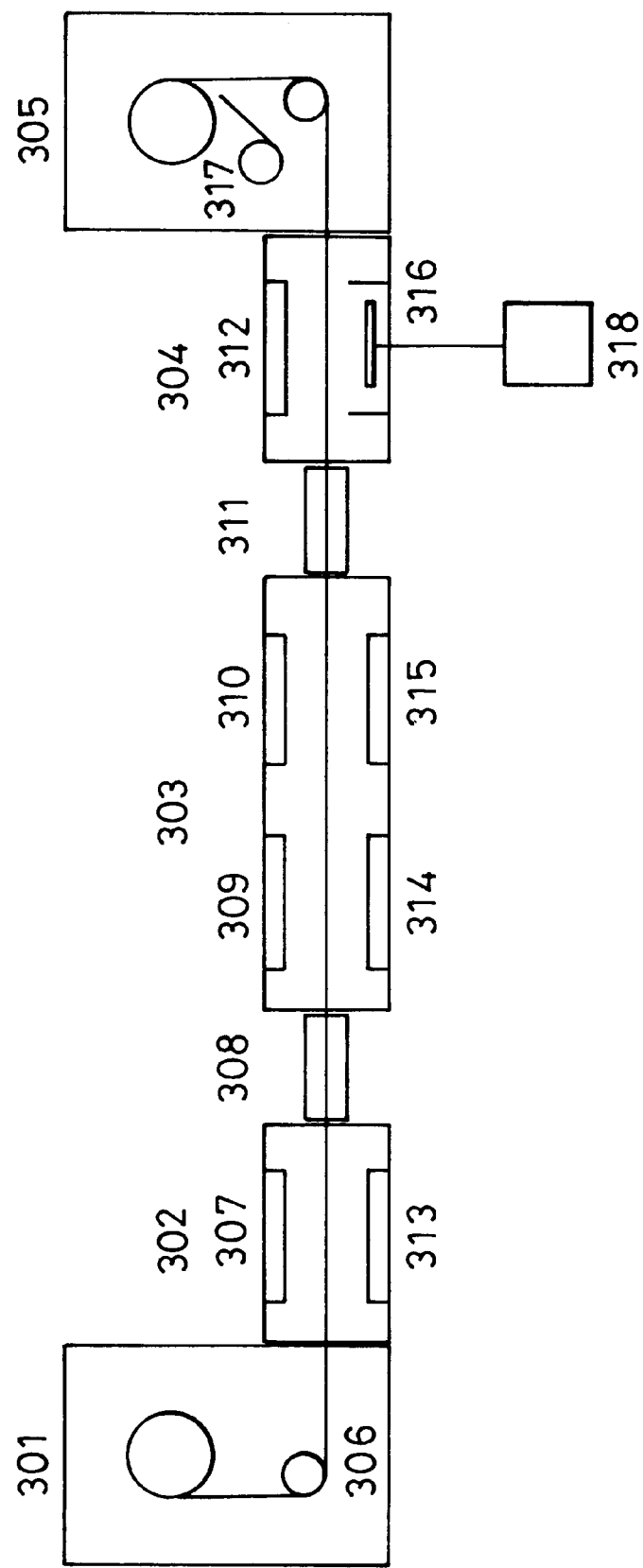
FIG. 3 is a schematic cross-sectional view of an apparatus for performing in series the steps of forming a reflection layer, putting the reflecting layer into contact with ionized gas, and forming a transparent conductive layer.

In Example 2, a reflection layer and an uneven transparent conductive layer were formed in an in-line system shown in FIG. 3, and the surface of the transparent conductive layer was put into contact with ionized gas.

A dull-finished stainless steel (SUS430) substrate having a length of 150 mm, a width of 120 nm and a thickness of 0.15 mm was used as a roll substrate 306. The roll substrate 306 was placed into a feeding chamber 301 shown in FIG. 3, and the feeding chamber 301 was evacuated to $10^{-5}$ torr. Gaseous argon was fed to processing chambers 302, 303, and 304 and gates 308 and 311 at 30 sccm, while a reflection-layer-preparation chamber 302 and a transparent-conductive-layer-preparation chamber 303 were maintained at 3 mtorr by rotating an evacuating valve not shown in the drawing. The substrate in the transparent-conductive-layer-preparation chamber 303 was heated to 250° C. by the heating units 309 and 310. The roll substrate was moved towards a winding chamber 305 at a rate of 170 mm/min. by a servomotor not shown in the drawing.

Aluminum having a purity of 99.99 percent by weight was used as a square target 313 for depositing a reflection layer. The target 313 had sides of 25 cm. A DC current of 400 W was applied to the target. An aluminum reflection layer 101 having approximately 200 nm was deposited on the substrate 306 while the substrate 306 traveled on the target 313 for 90 seconds.

Zinc oxide having a purity of 99.99 percent by weight was used as targets 314 and 315. These targets 314 and 315 had a size of 25-cm square. A DC current of 2800 W was applied to each target. A zinc-oxide transparent conductive layer 102 having a thickness of approximately 100 nm was deposited while the substrate 306 traveled in the chamber 303 for 180 seconds. The surface of the transparent conductive layer had a mean distance between relative minimums of 300 nm and a mean tilt angle of 15°.

In a treating chamber 304 by ionized gas, a DC current of 400 W was applied between and the substrate 306 and the counter electrode 316 as the positive electrode. Since the treating chamber 304 was maintained at 1 torr in order to achieve satisfactory discharge, the gate 311 having large conductance was provided in order to maintain the difference in pressure between these two chambers 303 and 304. The substrate 306 was heated to 250° C. in the treating chamber 304.

The treated substrate 306 was wound up in the winding chamber 305. The substrate was wound together with a polyester film 317 to protect the surface of the transparent conductive layer. After 10 hours, the reflection layer and the transparent conductive layer were deposited on the about 100-m substrate and treated with ionized gas at a moving rate of 170 mm/min.

The surface of the treated substrate had a mean distance between relative minimums of 290 nm and a mean tilt angle of 14° according to observation by an atomic force microscope. The surface was confirmed to be slightly planarized by the treatment with ionized gas.

The treated substrate was cut into a square piece having a side of 5 cm and a photovoltaic device was formed as in Example 1. The photovoltaic device was irradiated with light of AM1.5 (100 mW/cm$^2$) to evaluate its photovoltaic efficiency. The photovoltaic efficiency was 114% of that of the (non-etched) photovoltaic device of Comparative Example 1. The devices were subjected to an environmental test in an environmental box at 85° C. and 85% humidity for 1,000 hours. The photovoltaic efficiencies decreased by just 0.01%, which is a highly satisfactory level in practical use.

EXAMPLE 4

A reflection layer with a thickness of 70 nm and a transparent conductive layer with a thickness of 100 nm were formed as in Example 1. The sample was subjected to electrodeposition. The sample as a cathode and a zinc plate as an anode were placed into an aqueous 0.2 mol/l zinc nitrate solution, and then a DC voltage with a current density of 4 mA/cm$^2$ was applied between both electrodes for 5 min at 80° C. A zinc oxide film with a thickness of approximately 1,000 nm was deposited on the sample. The surface of the sample had a mean distance between relative minimums of 280 nm and a mean tilt angle of 20° according to atomic force microscopic observation.

The sample was subjected to the treatment with ionized gas as in Example 1, that is, at 300° C. for 20 seconds. The surface of the sample had a mean distance between relative minimums of 280 nm and a mean tilt angle of 20° according to atomic force microscopic observation. The surface did not substantially change by the treatment.

A photovoltaic device was prepared as in Example 1. The photovoltaic device was irradiated with light of AM1.5 (100 mW/cm$^2$) to evaluate its photovoltaic efficiency. The photovoltaic efficiency was 115% of that of the (non-etched) photovoltaic device of Comparative Example 1. The devices were subjected to an environmental test in an environmental box at 85° C. and 85% humidity for 1,000 hours. The photovoltaic efficiencies decreased by just 0.03%, which is a highly satisfactory level in practical use.

Comparative Example 3

Two substrates were prepared. A reflection layer with a thickness of 70 nm and a transparent conductive layer with a thickness of 100 nm were formed on each substrate as in Example 1. Each sample was subjected to electrodeposition. The sample as a cathode and a zinc plate as an anode were placed into an aqueous 0.5 mol/l zinc nitrate solution, and then a DC voltage with a current density of 4 mA/cm$^2$ was applied between both electrodes for 5 min at 80° C. The surface of each sample had a mean distance between relative minimums of 2,500 nm and a mean tilt angle of 20° according to atomic force microscopic observation. An electron microscopic image of the surface shows large and sharp roughness.

One sample was subjected to the treatment with ionized gas as in Example 1, that is, at 300° C. for 20 seconds. The surface of the sample had a mean distance between relative minimums of 2,500 nm and a mean tilt angle of 20° according to atomic force microscopic observation. The surface did not change substantially by the treatment. The other sample was treated with ionized gas as in Comparative Example 2, that is, at 300° C. for 10 minutes. The surface of the sample had a mean distance between relative minimums of 2,200 nm and a mean tilt angle of 4.8°.

Two photovoltaic devices were prepared using these samples as in Example 1. The photovoltaic devices were irradiated with light of AM1.5 (100 mW/cm$^2$) to evaluate their photovoltaic efficiency. The photovoltaic efficiencies were approximately 40% and 80%, respectively, of that of the (non-etched) photovoltaic device of Comparative Example 1. These values significantly changed during the measurement. The results suggest that the protruded section is planarized to some extent but the indented section is not modified during the treatment with ionized gas for 10 minutes, hence the semiconductor layer does not satisfactorily cover the rough surface, resulting in defects of the photovoltaic devices.

As described above, the transparent conductive layer prepared by the method in accordance with the present invention is capable of making a photovoltaic device having high photovoltaic conversion, that is, a high photocurrent without a decreased fill factor. Thus, the photovoltaic device can be used in a smaller size. Further, the method permits continuous production of photovoltaic devices by an in-line system with low production costs, hence the inexpensive devices having high reliability will be useful in a systematic electrical power supply.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A method for making a photovoltaic device comprising the steps of:
   (a) forming a transparent conductive layer on a substrate,
   (b) putting the surface of the transparent conductive layer into contact with an ionized inert gas, and
   (c) forming a semiconductor layer thereon.

2. A method for making a photovoltaic device according to claim 1, further comprising the step of etching the surface of the transparent conductive layer before said step (b).

3. A method for making a photovoltaic device according to claim 1, wherein the transparent conductive layer is formed such that in the cross-section of the transparent conductive layer, a mean distance between relative minimum points is 2,000 nm or less and a mean tilt angle between a surface line originating from a measuring point and a base line connecting to the nearest two adjacent relative minimum points over the entire measured region is 5° or more.

4. A method for making a photovoltaic device according to claim 3, wherein the processing time in said step (b) is controlled such that the mean tilt angle is 5° or more.

5. A method for making a photovoltaic device according to claim 1, wherein, in said step (b), the substrate is maintained at a temperature between 100° C. and 400° C.

6. A method for making a photovoltaic device according to claim 1, wherein in said step (a), the transparent conductive layer is formed by a sputtering process and/or an electrodeposition process.

7. A method for making a photovoltaic device according to claim 1, wherein the transparent conductive layer comprises at least one material selected form the group consisting of zinc oxide, indium oxide, and tin oxide.

8. A method for making a photovoltaic device according to claim 1, wherein said step (a) and said step (b) are performed in series in a systematic apparatus.

9. A method for making a photovoltaic device according to claim 1, wherein said step (a), said step (b), and said step (c) are performed in series in a systematic apparatus.

10. A method for making a photovoltaic device according to claim 1, wherein the substrate is a long belt substrate.

11. A method for making a photovoltaic device according to claim 1, further comprising the step of forming a metal layer on the substrate before said step (a).

12. A photovoltaic device comprising a substrate, a transparent conductive layer having a rough surface, and a semiconductor layer, wherein, in the cross-section of said transparent conductive layer, a mean distance between relative minimum points is 2,000 nm or less and a mean tilt angle between a surface line originating from a measuring point and a base line connecting to the nearest two adjacent relative minimum points over the entire measured region is 5° or more.

13. A photovoltaic device according to claim 12, wherein a metal layer is provided between said substrate and said transparent conductive layer.

* * * * *